United States Patent
Leobandung

(10) Patent No.: US 12,114,495 B2
(45) Date of Patent: Oct. 8, 2024

(54) VERTICAL THREE-DIMENSIONAL STACK NOR FLASH MEMORY

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 295 days.

(21) Appl. No.: 17/477,040

(22) Filed: Sep. 16, 2021

(65) Prior Publication Data
US 2023/0079093 A1    Mar. 16, 2023

(51) Int. Cl.
| H10B 41/27 | (2023.01) |
| H01L 29/66 | (2006.01) |
| H01L 29/788 | (2006.01) |
| H10B 41/30 | (2023.01) |

(52) U.S. Cl.
CPC ....... H10B 41/27 (2023.02); H01L 29/66825 (2013.01); H01L 29/788 (2013.01); H10B 41/30 (2023.02)

(58) Field of Classification Search
CPC .............................................. H10B 41/00–70
See application file for complete search history.

(56) References Cited

U.S. PATENT DOCUMENTS

| 8,383,512 | B2 | 2/2013 | Chen et al. |
| 8,630,114 | B2 | 1/2014 | Lue |
| 8,946,076 | B2 | 2/2015 | Simsek-Ege et al. |
| 9,000,510 | B2 * | 4/2015 | Hong ............... H01L 29/7926 365/72 |
| 9,425,209 | B1 | 8/2016 | Yang et al. |
| 9,589,982 | B1 | 3/2017 | Cheng et al. |
| 10,090,316 | B2 | 10/2018 | Ootsuka |
| 10,600,681 | B2 | 3/2020 | Williamson et al. |
| 10,861,870 | B2 | 12/2020 | Lilak et al. |
| 11,024,636 | B1 | 6/2021 | Leobandung |
| 2002/0177322 | A1 | 11/2002 | Li et al. |
| 2012/0182801 | A1 | 7/2012 | Lue |

(Continued)

OTHER PUBLICATIONS

Z. Fahimi et al., "Mixed-Signal Computing with Non-Volatile Memories," Proc. SRC TechCon' 18, Austin, TX (Sep. 2018) (4 pages).

(Continued)

*Primary Examiner* — Laura M Menz
*Assistant Examiner* — Candice Chan
(74) *Attorney, Agent, or Firm* — Samuel A. Waldbaum

(57) ABSTRACT

3D NOR flash memory devices having vertically stacked memory cells are provided. In one aspect, a memory device includes: a word line/bit line stack with alternating word lines and bit lines separated by dielectric layers disposed on a substrate; a channel that extends vertically through the word line/bit line stack; and a floating gate stack surrounding the channel, wherein the floating gate stack is present between the word lines and the channel, and wherein the bit lines are in direct contact with both the channel and the floating gate stack. Techniques for configuring the memory device for neuromorphic computing are provided, as are methods of fabricating the memory device.

15 Claims, 16 Drawing Sheets

(56) References Cited

U.S. PATENT DOCUMENTS

| | | | |
|---|---|---|---|
| 2013/0052803 A1* | 2/2013 | Roizin | H01L 29/40117 257/E21.09 |
| 2020/0152650 A1 | 5/2020 | Thimmegowda et al. | |
| 2021/0118904 A1 | 4/2021 | Lui et al. | |
| 2021/0158868 A1 | 5/2021 | Prabhakar et al. | |
| 2021/0210498 A1 | 7/2021 | Leobandung | |

OTHER PUBLICATIONS

Fick et al., "Analog Computation in Flash Memory for Datacenter-scale AI Inference in a Small Chip," Hot Chip, Aug. 2018 (28 pages).

International Search Report and Written Opinion for PCT/EP2022/070631 dated Nov. 22, 2022 (10 pages).

* cited by examiner

VERTICAL THREE-DIMENSIONAL STACK NOR FLASH MEMORY

FIELD OF THE INVENTION

The present invention relates to flash memory devices, and more particularly, to three-dimensional (3D) NOR flash memory devices having vertically stacked memory cells, and techniques for fabrication thereof.

BACKGROUND OF THE INVENTION

Flash memory is a non-volatile, rewritable computer memory storage device. A common example of a flash memory device is a USB flash drive. The two main types of flash memory are NAND flash memory and NOR flash memory. Both NAND flash memory and NOR flash memory utilize a floating gate memory design. However, as their names imply, NAND flash memory circuits employ a NAND logic gate design, whereas NOR flash memory circuits employ a NOR logic gate design. Based on the differences in their design, NAND flash memory is written and read in blocks, whereas NOR flash memory can read and write bytes independently.

Flash memory devices often include a controller device coupled in series to multiple memory cells. The memory cells can be arranged two-dimensionally (2-D), i.e., a planar design including a single layer of the memory cells. However, to increase capacity, three-dimensional (3D) flash memory designs have been employed where the memory cells are stacked vertically, one on top of the other. See, for example, U.S. Pat. No. 8,946,076 issued to Simsek-Ege et al., entitled "Methods of Fabricating Integrated Structures, and Methods of Forming Vertically-Stacked Memory Cells" which describes a vertical NAND string of memory cells.

While numerous 3D NAND flash memory architectures exist, some applications require a NOR configuration where bytes can be read and written independently. However, the options for 3D NOR flash memory designs are limited. See, e.g., U.S. Patent Application Publication Number 2012/0182801 by Lue, entitled "Memory Architecture of 3D NOR Array." Further, the architectures that have been proposed involve complex and costly approaches.

Accordingly, efficient and effective 3D stacked NOR flash memory device designs and techniques for fabrication thereof would be desirable.

SUMMARY OF THE INVENTION

The present invention provides three-dimensional (3D) NOR flash memory devices having vertically stacked memory cells, and techniques for fabrication thereof. In one aspect of the invention, a memory device is provided. The memory device includes: a word line/bit line stack with alternating word lines and bit lines separated by dielectric layers disposed on a substrate; a channel that extends vertically through the word line/bit line stack; and a floating gate stack surrounding the channel, wherein the floating gate stack is present between the word lines and the channel, and wherein the bit lines are in direct contact with both the channel and the floating gate stack.

In another aspect of the invention, a neuromorphic computing device is provided. The neuromorphic computing device includes: a word line/bit line stack having a staircase design with alternating word lines and bit lines separated by dielectric layers disposed on a substrate; a channel that extends vertically through the word line/bit line stack; a floating gate stack surrounding the channel, wherein the floating gate stack is present between the word lines and the channel, and wherein the bit lines are in direct contact with both the channel and the floating gate stack; individual top word line contacts to each of the word lines; and at least one top bit line contact to the channel and the bit lines.

In yet another aspect of the invention, a method of fabricating a memory device is provided. The method includes: forming a word line/bit line stack with alternating word lines and sacrificial bit lines separated by dielectric layers on a substrate; patterning the word lines, the bit lines and the dielectric layers to form a patterned word line/bit line stack having a staircase-shaped design; forming a channel hole that extends vertically through the patterned word line/bit line stack; depositing a floating gate stack into, and lining, the channel hole; depositing a channel material into the channel hole to form a channel over the floating gate stack; selectively removing the sacrificial bit lines to form cavities in the patterned word line/bit line stack; etching-back the floating gate stack through the cavities to selectively expose the channel; and forming replacement bit lines in the cavities that are in direct contact with both the floating gate stack and the channel.

A more complete understanding of the present invention, as well as further features and advantages of the present invention, will be obtained by reference to the following detailed description and drawings.

DETAILED DESCRIPTION OF PREFERRED EMBODIMENTS

As provided above, the two main types of flash memory are NAND flash memory and NOR flash memory, both of which utilize a floating gate memory design. However, some applications require a NOR flash memory configuration which enables reading and writing of individual bytes. One such application is the use of NOR flash memory as elements in a neural network.

In machine learning and cognitive science, neural networks are a family of statistical learning models inspired by the biological neural networks of animals, and in particular the brain. Neural networks may be used to estimate or approximate systems and cognitive functions that depend on a large number of inputs and weights of the connections which are generally unknown.

Figure 1:
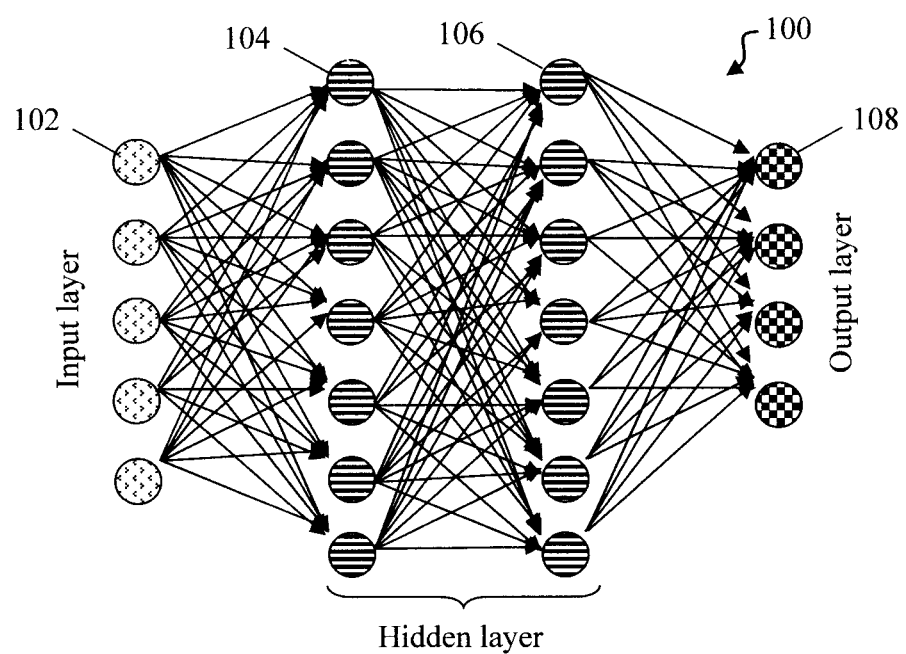
FIG. 1 is a schematic diagram illustrating an exemplary neural network according to an embodiment of the present invention.

Neural networks are often embodied as so-called "neuromorphic" systems of interconnected processor elements that act as simulated "neurons" that exchange "messages" between each other in the form of electronic signals. See, for example, FIG. 1 which provides a schematic illustration of an exemplary neural network 100. As shown in FIG. 1, neural network 100 includes a plurality of interconnected processor elements 102, 104/106 and 108 that form an input layer, at least one hidden layer, and an output layer, respectively, of the neural network 100.

Similar to the so-called 'plasticity' of synaptic neurotransmitter connections that carry messages between biological neurons, the connections in a neural network that carry electronic messages between simulated neurons are provided with numeric weights that correspond to the strength or weakness of a given connection. The weights can be adjusted and tuned based on experience, making neural networks adaptive to inputs and capable of learning. For example, a control policy neural network is defined by a set of input neurons (see, e.g., input layer 102 in neural network 100). After being weighted and transformed by a function determined by the network's designer, activations of these input neurons are passed to other downstream neurons, which are often referred to as 'hidden' neurons (see, e.g., hidden layers 104 and 106 in neural network 100). This process is repeated until an output neuron is activated (see, e.g., output layer 108 in neural network 100). The activated output neuron makes a class decision. Instead of utilizing the traditional digital model of manipulating zeros and ones, neural networks such as neural network 100 create connections between processing elements that are substantially the functional equivalent of the core system functionality that is being estimated or approximated.

By way of example only, neural network 100 can be embodied in an analog cross-point array of non-volatile memory devices such as a NOR floating gate flash memory device. Namely, the memory cells of a NOR floating gate flash memory device can be implemented as the adjustable synapses in a neural network. See, for example, Z. Fahimi et al., "Mixed-Signal Computing with Non-Volatile Memories," Proc. SRC TechCon' 18, Austin, TX (September 2018) (4 pages). See also, Fick et al., "Analog Computation in Flash Memory for Datacenter-scale AI Inference in a Small Chip," Hot Chip, August 2018 (28 pages).

However, a drawback with conventional two-dimensional (2D), planar NOR flash memory designs is their large footprint. Advantageously, provided herein are three-dimensional (3D) NOR flash memory device designs having vertically stacked memory cells which vastly reduces the overall footprint of the device. The present 3D NOR flash memory device designs can be leveraged for a variety of non-volatile, flash memory applications. For instance, according to an exemplary embodiment, the present 3D NOR stacked memory cells serve as neural network elements.

Figure 2:
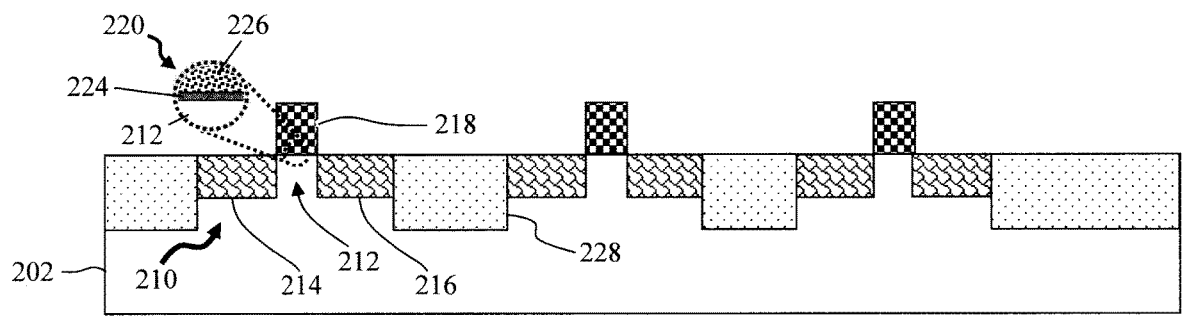
FIG. 2 is a cross-sectional diagram illustrating at least one field effect transistor (FET) having been formed on a substrate according to an embodiment of the present invention.

An exemplary methodology for fabricating the present 3D NOR flash memory device is now described by way of reference to FIGS. 2-19. As shown in FIG. 2, the process begins with the formation of at least one field effect transistor (FET) 210 on a substrate 202. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

As shown in FIG. 2, each FET 210 includes a channel 212 interconnecting source/drain regions 214 and 216. A gate 218 regulates current flow through the channel 212. According to an exemplary embodiment, source/drain regions 214 and 216 are formed from an in-situ doped (i.e., where a dopant(s) is introduced during growth) or an ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

As illustrated in magnified view 220, in one embodiment each gate 218 includes a gate dielectric 224 disposed on the channel 212, and a gate conductor 226 disposed on the gate dielectric 224. Although not explicitly shown in magnified view 220, a thin (e.g., from about 0.3 nm to about 5 nm) interfacial oxide (e.g., silicon oxide (SiOx) which may include other chemical elements in it such as nitrogen (N), germanium (Ge), etc.) can first be formed on exposed surfaces of the channel 212. In that case, the gate dielectric 224 is then deposited over the interfacial oxide, e.g., using a process such as chemical vapor deposition (CVD), atomic layer deposition (ALD), or physical vapor deposition (PVD). Generally, FETs 210 can be formed using either a gate-first or a gate-last process. A gate-first process involves forming gate 218 over the channel 212 prior to placement of the source/drain regions 214 and 216. By contrast, with a gate-last approach, sacrificial gates (not shown) are formed over the channel 212 early on in the fabrication process. The term 'sacrificial,' as used herein, generally refers to a structure that is removed, in whole or in part, during fabrication. The sacrificial gates are then used to place the source/drain regions 214 and 216 on opposite ends of the channel 212.

Following formation of the source/drain regions 214 and 216, the sacrificial gates are removed and replaced with the final (replacement) gates of the device, i.e., gates 218. When the replacement gates are metal gates, they are also referred to herein as replacement metal gates or RMGs. A notable advantage of the gate-last approach is that it prevents the final gate components from being exposed to potentially damaging conditions experienced during fabrication, such as elevated temperatures. Of particular concern are high-κ gate dielectrics which can be damaged by exposure to elevated temperatures such as those experienced during formation of the source/drain regions 214 and 216.

Suitable materials for the gate dielectric 224 include, but are not limited to, silicon dioxide ($SiO_2$) and/or a high-κ material. The term "high-κ," as used herein, refers to a material having a relative dielectric constant κ which is much higher than that of $SiO_2$ (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$).

Suitable materials for the gate conductor 226 include, but are not limited to, doped polysilicon and/or at least one workfunction-setting metal. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nanometers (nm)) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD, evaporation, sputtering or electrochemical plating can be employed to deposit the gate conductor 226 over the gate dielectric 224.

In order to isolate the FETs 210 from one another, shallow trench isolation (STI) regions 228 are formed in the substrate 202 in between adjacent FETs 210. See FIG. 2. To form STI regions 228, trenches patterned in the substrate 202 in between the FETs 210 are filled with a dielectric material such as an oxide material (also generally referred to herein as an 'STI oxide'). Suitable STI oxides include, but are not limited to, oxide low-κ materials such as silicon oxide (SiOx) and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). Following deposition, the STI oxide is recessed to form the STI regions 228. An oxide-selective etch can then be employed to recess the STI oxide. Although not explicitly shown in the figures, a liner (e.g., a thermal oxide or silicon nitride (SiN)) can be deposited into the trenches prior to the STI oxide.

An interlayer dielectric (ILD) 302 is then deposited onto the substrate 202 over the FETs 210. See FIG. 3. Suitable materials for ILD 302 include, but are not limited to, oxide low-κ materials such as SiOx and/or SiCOH and/or ULK-ILD materials such as pSiCOH. A process such as CVD, ALD or PVD can be employed to deposit the ILD 302 onto the substrate 202. Following deposition, the ILD 302 can be planarized using a process such as chemical mechanical polishing (CMP).

Figure 3:
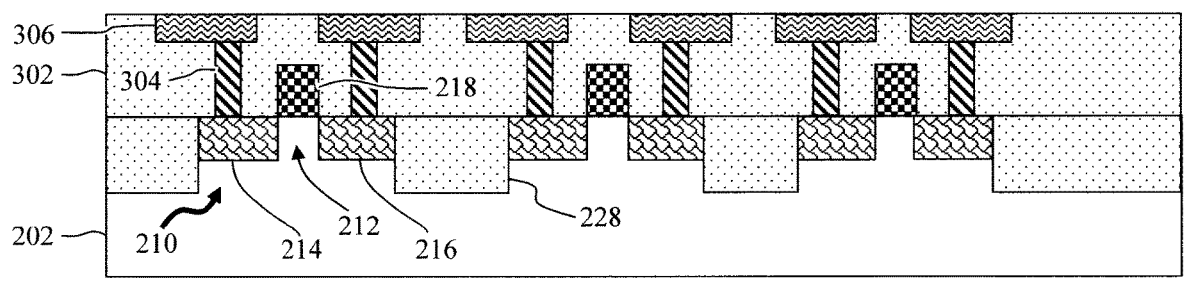
FIG. 3 is a cross-sectional diagram illustrating a (first) interlayer dielectric (ILD) having been deposited onto the substrate over the FETs, and source/drain contacts and metal pads having been formed in the first ILD according to an embodiment of the present invention.
Figure 4:
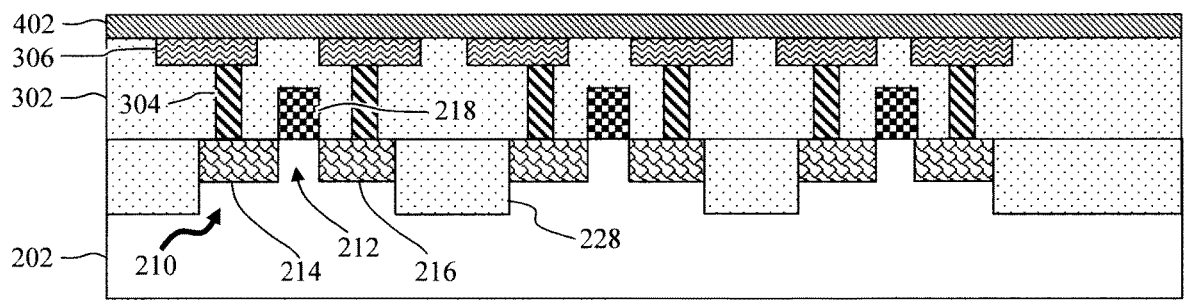
FIG. 4 is a cross-sectional diagram illustrating an insulator layer having been formed on the first ILD over the FETs, source/drain contacts and metal pads according to an embodiment of the present invention.

As shown in FIG. 3, source/drain contacts 304 and metal pads 306 are then formed in the ILD 302. In the present example, a source/drain contact 304 is formed in direct contact with each of the source/drain regions 214 and 216, and a metal pad 306 is formed in direct contact with each of the source/drain contacts 304.

By way of example only, a dual damascene process can be employed to form source/drain contacts 304 and metal pads 306 in ILD 302. With a dual damascene process, standard lithography and etching techniques are first used to pattern features in the ILD 302 such as trenches and vias, with the trench positioned over the via. With standard lithography and etching techniques, a lithographic stack (not shown), e.g., photoresist/organic planarizing layer (OPL)/anti-reflective coating (ARC), is used to pattern a hardmask (not shown) with the footprint and location of the features to be patterned (in this case trenches and/or vias). When a trench is patterned before the via, it is referred to as a trench-first process. Conversely, when a via is patterned before the trench, it is referred to as a via-first process. The features (i.e., trenches and/or vias) are then filled with a metal or a combination of metals to form the metal pads 306 and source/drain contacts 304, respectively.

Suitable metals include, but are not limited to, copper (Cu), tungsten (W), ruthenium (Ru), cobalt (Co), nickel (Ni) and/or platinum (Pt). The metal(s) can be deposited into the trenches and/or vias using a process such as evaporation, sputtering, or electrochemical plating. Following deposition, the metal overburden can be removed using a process such as CMP. Prior to depositing the metal(s), a barrier layer (not shown) can be deposited into and lining the trenches and/or vias. Use of such a barrier layer helps to prevent diffusion of the metal(s) into the surrounding ILD 302. Suitable barrier layer materials include, but are not limited to, ruthenium (Ru), tantalum (Ta), tantalum nitride (TaN), titanium (Ti) and/or titanium nitride (TiN). Additionally, a seed layer (not shown) can be deposited into and lining the trenches and/or vias prior to metal deposition, i.e., in order to facilitate plating of the metal into the trenches and/or vias.

An insulator layer 402 is then formed on the ILD 302 over the FETs 210, source/drain contacts 304 and metal pads 306. See FIG. 4. As will become apparent from the description that follows below, the insulator layer 402 serves to electrically isolate the FETs 210 from the memory stack that will be constructed on substrate 202 over the FETs 210. Suitable materials for the insulator layer 402 include, but are not limited to, SiN which can be deposited onto the ILD 302 using a process such as CVD, ALD or PVD. According to an exemplary embodiment, the insulator layer 402 is formed having a thickness of from about 5 nanometers (nm) to about 50 nm, and ranges therebetween.

A word line/bit line stack 502 is then formed on the substrate 202/insulator layer 402 over the FETs 210. See FIG. 5. As its name implies, the word line/bit line stack 502 (also referred to herein simply as 'stack 502') includes alternating, vertically-stacked word lines and bit lines separated by a dielectric. Thus, the size of the stack 502 is based on the number of word lines and bit lines included in the stack 502. It is notable that the size of stack 502 can vary depending, for example, on the desired number of floating gate transistors (see below) to be formed. Therefore, the stack size shown in the figures is provided merely for the purpose of illustrating the present techniques, and it is to be understood that stack 502 can include more (or fewer) word lines and bit lines than shown.

As will be described in detail below, each floating gate transistor of the present 3D NOR flash memory floating gate design includes both a floating gate and a control gate, with the floating gate being located in between the control gate and a channel of the floating gate transistor. A gate oxide separates the floating gate from the control gate, and a tunnel oxide separates the floating gate from the channel. The channel surrounded by the floating gate will be formed vertically through the center of the stack 502, with the word lines and bit lines oriented at the sides of the channel/floating gate. The word lines in stack 502 will serve as the control gates, and thus will be offset from the floating gate by the gate oxide. On the other hand, the bit lines in stack 502 will directly contact the channel. A technique contemplated herein for achieving this type of structure is through the use of sacrificial bit lines.

For instance, according to an exemplary embodiment, at this stage in the process the bit lines in stack 502 are sacrificial bit lines meaning that they will later be (completely) removed and replaced with the final, i.e., replacement, bit lines of the 3D NOR flash memory device. As will be described in detail below, following removal of the sacrificial bit lines, the floating gates are selectively etched to expose the channel. Doing so advantageously enables the replacement bit lines to directly contact the channel, while the word lines (i.e., the control gates) remain separated from the channel by the floating gates.

Figure 5:
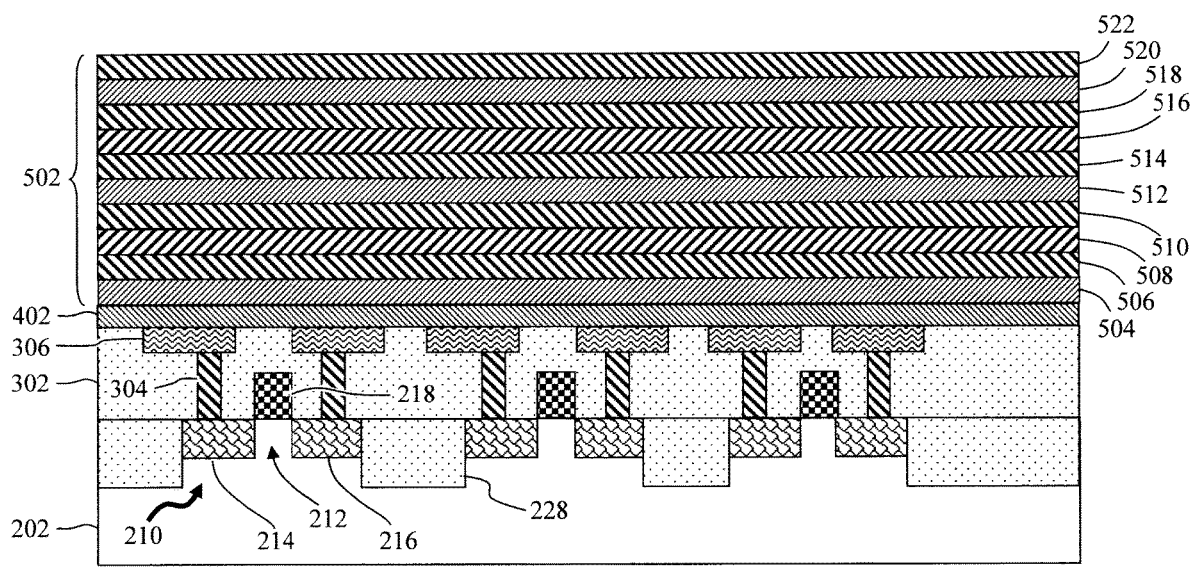
FIG. 5 is a cross-sectional diagram illustrating a word line/bit line stack with alternating word lines and sacrificial bit lines separated by dielectric layers having been formed on the substrate/insulator layer over the FETs according to an embodiment of the present invention.

With the above concepts in mind, as shown in FIG. 5 the formation of stack 502 begins with the formation of a (first) word line 504 on the insulator layer 402. Suitable materials for word line 504 include electrical conductors such as, but not limited to, doped polysilicon, tungsten (W), titanium (Ti), tantalum (Ta), titanium nitride (TiN) and/or tantalum nitride (TaN), which can be deposited onto the insulator layer 402 using a process such as CVD, ALD, PVD, evaporation or sputtering. According to an exemplary embodiment, word line 504 is formed having a thickness of from about 5 nm to about 50 nm and ranges therebetween.

A (first) dielectric layer 506 is then formed on word line 504. Suitable materials for dielectric layer 506 include, but are not limited to, oxide dielectric materials such as SiOx and/or silicon oxycarbide (SiOC), which can be deposited on the word line 504 using a process such as CVD, ALD or PVD. According to an exemplary embodiment, dielectric layer 506 is formed having a thickness of from about 5 nm to about 20 nm and ranges therebetween.

Next, a (first) sacrificial bit line 508 is formed on the dielectric layer 506. Suitable materials for sacrificial bit line 508 include, but are not limited to, amorphous carbon, polysilicon and/or silicon carbide (SiC), which can be deposited onto the dielectric layer 506 using a process such as CVD, ALD or PVD. According to an exemplary embodiment, sacrificial bit line 508 is formed having a thickness of from about 5 nm to about 50 nm and ranges therebetween.

As highlighted above, the use of sacrificial bit lines at this point in the process, i.e., prior to formation of the central channel and floating gate, will advantageously enable the floating gates to offset the word lines (i.e., the control gates) from the channel while later placing the replacement bit lines in direct contact with the channel. To do so, the sacrificial bit lines need to be selectively removable with respect to the word lines and the dielectric layers. For instance, by way of example only, unlike metals and dielectrics, amorphous carbon is ashable and thus can be selectively removed using an ashing process. For polysilicon, a polysilicon-selective wet chemical or gas-phase etch can be employed. A plasma etch with a hydrogen-containing fluorocarbon gas and an oxygen-containing gas can be employed to etch SiC selective to dielectrics. See, for example, U.S. Patent Application Publication Number 2002/0177322 by Li et al., entitled "Method of Plasma Etching of Silicon Carbide."

A (second) dielectric layer 510 is next formed on the sacrificial bit line 508. As above, suitable materials for dielectric layer 510 include, but are not limited to, oxide dielectric materials such as SiOx and/or SiOC which can be deposited onto the sacrificial bit line 508 using a process such as CVD, ALD or PVD. According to an exemplary embodiment, dielectric layer 510 is formed having a thickness of from about 5 nm to about 20 nm and ranges therebetween.

The above-described process is then repeated to form additional (second, third, fourth, etc.) word lines/dielectric layers/sacrificial bit lines on the stack 502. See, for example, word lines 512, 520, etc., dielectric layers 514, 518, 522, etc., and sacrificial bit lines 516, etc. Thus, the resulting stack 502 includes alternating word lines 512, 520, etc. and sacrificial bit lines 516, etc. separated by dielectric layers 514, 518, 522, etc.

According to an exemplary embodiment, the configuration of each of word lines 512, 520, etc. is the same as that of word line 504. Namely, each of the word lines 512, 520, etc. is formed from a material such as W, Ti, Ta, TiN and/or TaN deposited using a process such as CVD, ALD, PVD, evaporation or sputtering to a thickness of from about 5 nm to about 50 nm and ranges therebetween. Similarly, the configuration of each of the dielectric layers 514, 518, 522, etc. is the same as that of dielectric layers 506 and 510. Namely, each of dielectric layers 514, 518, 522, etc. is formed from an oxide dielectric material such as SiOx and/or SiOC deposited using a process such as CVD, ALD or PVD to a thickness of from about 5 nm to about 20 nm and ranges therebetween. As well, the configuration of sacrificial bit lines 516, etc. is the same as that of sacrificial bit line 508. Namely, sacrificial bit lines 516, etc. are formed from a material such as, amorphous carbon, polysilicon and/or SiC deposited using a process such as CVD, ALD or PVD to a thickness of from about 5 nm to about 50 nm and ranges therebetween.

Figure 6:
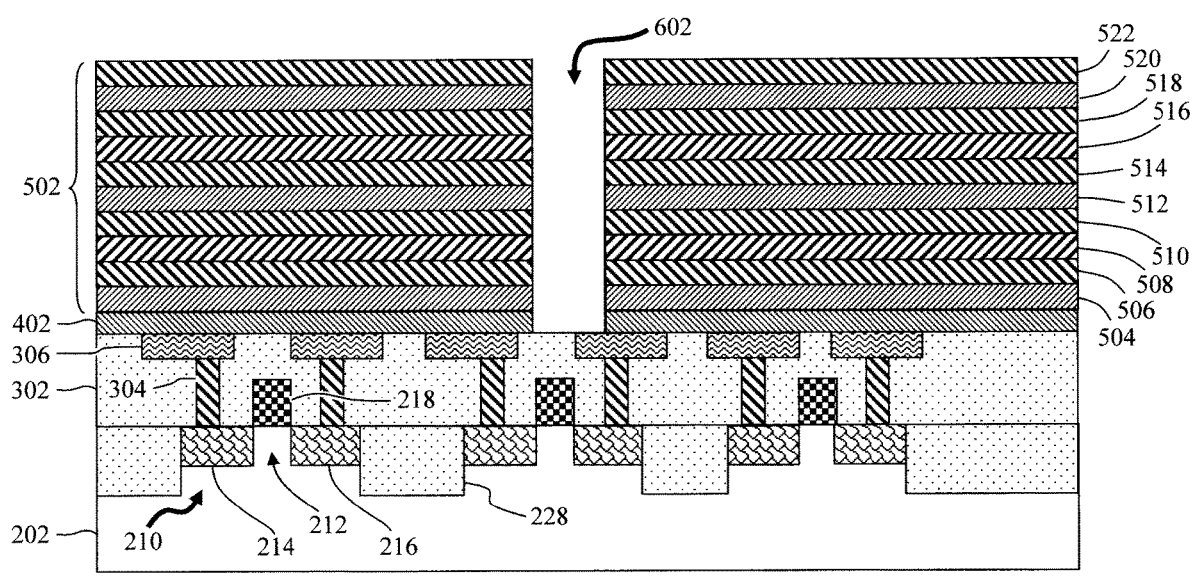
FIG. 6 is a cross-sectional diagram illustrating a channel hole having been formed in the word line/bit line stack that extends vertically through the word line/bit line stack according to an embodiment of the present invention.
Figure 7:
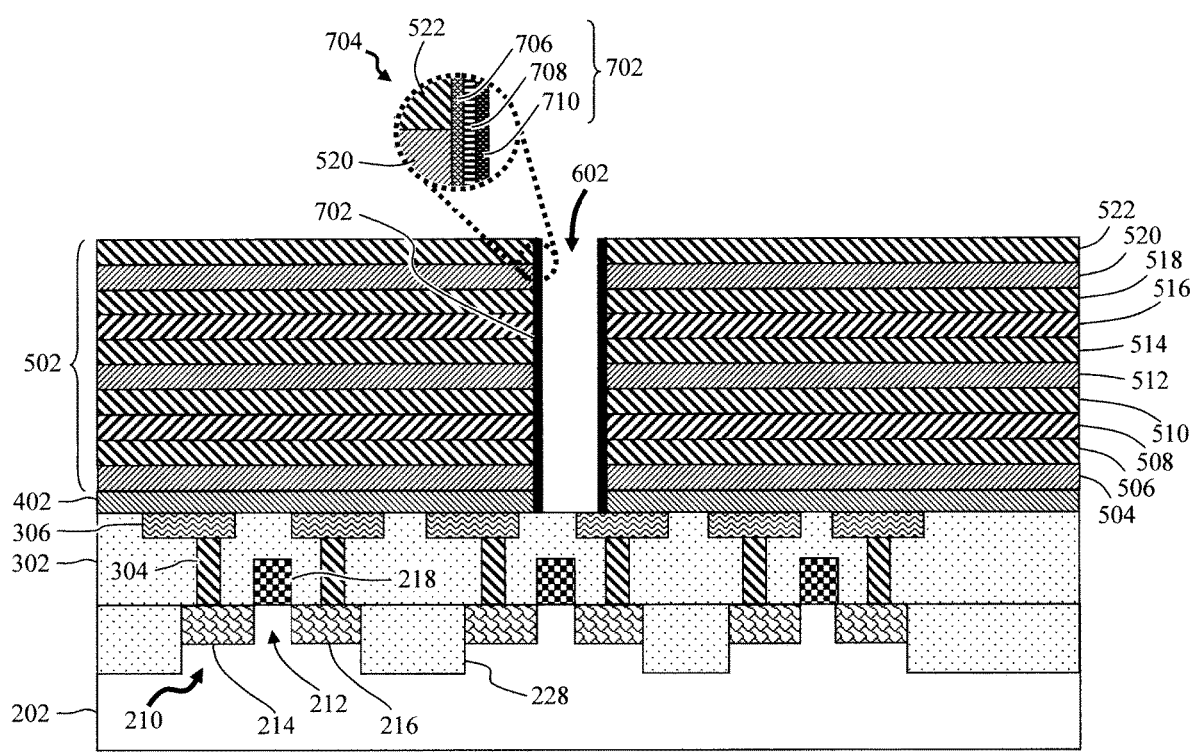
FIG. 7 is a cross-sectional diagram illustrating a floating gate stack having been deposited into, and lining, the channel hole, the floating gate stack having a floating gate present between a gate oxide and a tunnel oxide according to an embodiment of the present invention.
Figure 8:
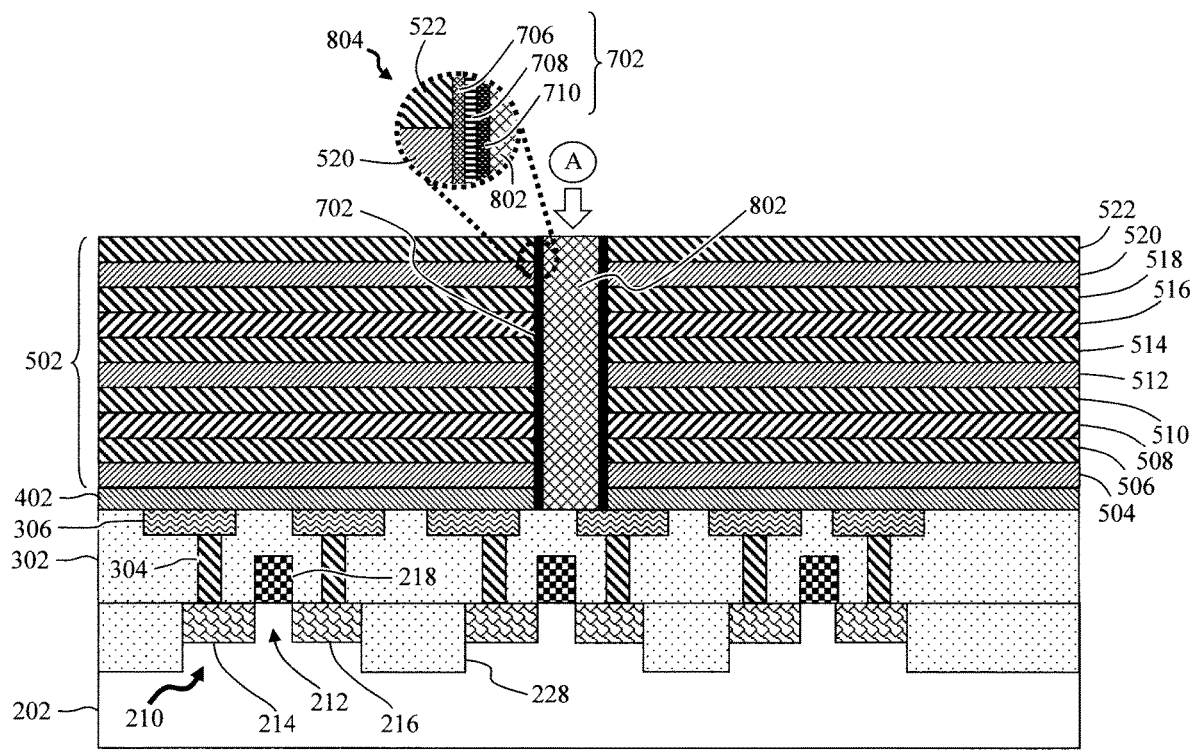
FIG. 8 is a cross-sectional diagram illustrating a channel material having been deposited into, and filling, the channel hole to form a channel that extends vertically through the center of the word line/bit line stack over the floating gate stack according to an embodiment of the present invention.

As highlighted above, a channel surrounded by the floating gate is formed vertically through the center of the stack 502. To do so, a channel hole 602 is first formed in the stack 502. See FIG. 6. As shown in FIG. 6, the channel hole 602 is formed at approximately the center of stack 502 and extends vertically through each word line 504, 512, 520, etc., dielectric layer 506, 510, 514, 518, 522, etc., and sacrificial bit line 508, 516, etc., as well through the insulator layer 402, exposing at least one of the underlying metal pads 306 in ILD 302. Standard lithography and etching techniques (see above) can be used to pattern channel hole 602 in stack 502. A directional (anisotropic) etching process such as reactive ion etching (RIE) can be employed for etching the channel hole 602.

A floating gate stack 702 is then deposited into, and lining, the channel hole 602. See FIG. 7. As shown in magnified view 704, the floating gate stack includes a floating gate 708 present between a gate oxide 706 and a tunnel oxide 710. Namely, the gate oxide 706 is formed on portions of insulator layer 402, word lines 504, 512, 520, etc., dielectric layers 506, 510, 514, 518, 522, etc., and sacrificial bit lines 508, 516, etc. exposed along the sidewalls of channel hole 602. Floating gate 708 is formed on the gate oxide 706, and tunnel oxide 710 is formed on the floating gate 708. As provided above, the word lines 504, 512, 520, etc. will serve as the control gates. Thus, the gate oxide 706 separates the floating gate 708 from the control gates (word lines 504, 512, 520, etc.), and the tunnel oxide 710 separates the floating gate 708 from the channel that is to be formed in the channel hole 602 over the floating gate stack 702 (see below).

Suitable materials for the gate oxide 706 include, but are not limited to, SiOx which can be deposited onto the portions of insulator layer 402, word lines 504, 512, 520, etc., dielectric layers 506, 510, 514, 518, 522, etc., and sacrificial bit lines 508, 516, etc. exposed along the sidewalls of channel hole 602 using a process such as CVD, ALD or PVD. According to an exemplary embodiment, the gate oxide 706 is formed having a thickness of from about 10 angstroms (Å) to about 100 Å and ranges therebetween. Suitable materials for the floating gate 708 include, but are not limited to, polysilicon, amorphous silicon and/or or silicon nitride (SiN) which can be deposited onto the gate oxide 706 using a process such as CVD, ALD or PVD. According to an exemplary embodiment, the floating gate 708 is formed having a thickness of from about 1 Å to about 100 Å and ranges therebetween. Suitable materials for the tunnel oxide 710 include, but are not limited to, SiOx which can be deposited onto the floating gate 708 using a process such as CVD, ALD or PVD. According to an exemplary embodiment, tunnel oxide 710 is formed having a thickness of from about 1 Å to about 50 Å and ranges therebetween.

Following deposition, the floating gate stack 702 can be removed from the bottom of the channel hole 602. See FIG. 7. Doing so will enable the channel that will be formed in the channel hole 602 over the floating gate stack 702 to contact one or more of the underlying metal pads 306. An anisotropic etching process such as RIE can be employed to remove the floating gate stack 702 materials from the bottom of the channel hole 602.

A channel material is then deposited into, and filling, the channel hole 602 to form a channel 802 that extends vertically through the center of the stack 502 over the floating gate stack 702. See FIG. 8. Suitable materials for channel 802 include, but are not limited to, polysilicon which can be deposited using a process such as CVD, ALD or PVD. Following deposition, the channel material can be polished using a process such as CMP. As shown in magnified view 804, the channel 802 is separated from the floating gate 708 of floating gate stack 702 by the tunnel oxide 710. More specifically, the tunnel oxide 710 is disposed on the channel 802, the floating gate 708 is disposed on the tunnel oxide 710, and the gate oxide 706 is disposed on the floating gate 708. Further, since the floating gate stack 702 materials were removed from the bottom of the channel hole 602 (see above), the channel 802 is able to directly contact at least one of the underlying metal pads 306. See FIG. 8.

Figure 9:
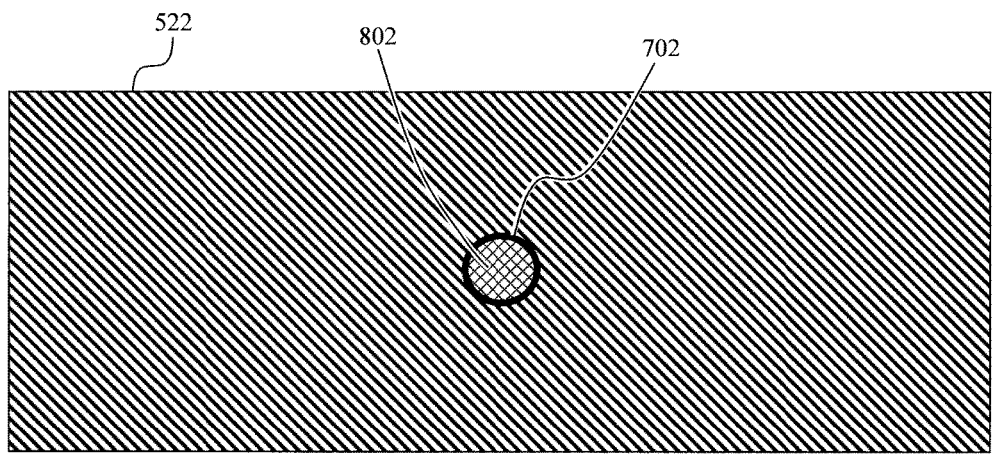
FIG. 9 is a top-down diagram illustrating that the channel can have a circular shape and be fully surrounded by the floating gate stack at the center of the word line/bit line stack, and how the layers of the word line/bit line stack are continuous around the channel and floating gate stack according to an embodiment of the present invention.

Referring briefly to FIG. 9, i.e., a top-down view from viewpoint A (see FIG. 8), it can be seen that in one exemplary embodiment the channel 802 has a circular or oval shape and is fully surrounded by the floating gate stack 702 at the center of the stack 502. As shown in FIG. 9, dielectric layer 522 and the underlying layers of stack 502 are continuous around the channel 802 and floating gate stack 702.

The word lines 504, 512, 520, etc., dielectric layers 506, 510, 514, 518, 522, etc., and sacrificial bit lines 508, 516, etc. in stack 502 are then patterned to form a staircase design. See FIG. 10. The patterned (word line and bit line) stack is now given the designation 502'. By 'staircase design' it is meant that the patterned stack 502' will be largest at the bottom, and that the footprint of each level or 'step' moving up the patterned stack 502' gets progressively smaller thus resembling a flight of stairs up a staircase. As will become apparent from the description that follows, the implementation of a stair case design will enable selective top-down access to each of the word lines 504, 512, 520, etc., and sacrificial bit lines 508, 516, etc. in patterned stack 502'. Namely, reducing the footprint of each level moving up the patterned stack 502' leaves a portion of the underlying level uncovered. That uncovered portion can then be used to access the word line or bit line in that level from the top-down as described below.

Figure 10:
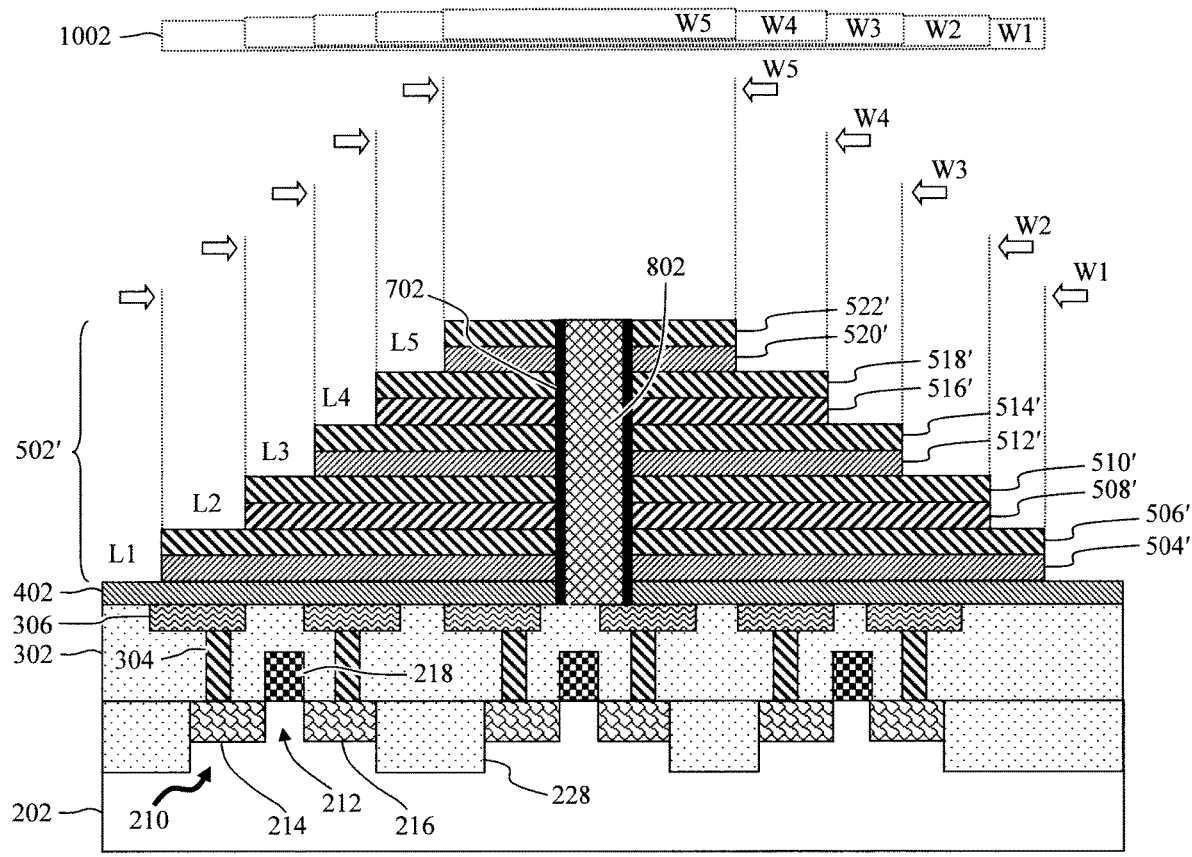
FIG. 10 is a cross-sectional diagram illustrating the word lines, dielectric layers, and sacrificial bit lines in the word line/bit line stack having been patterned to form a patterned word line/bit line stack having a staircase design according to an embodiment of the present invention.
Figure 11:
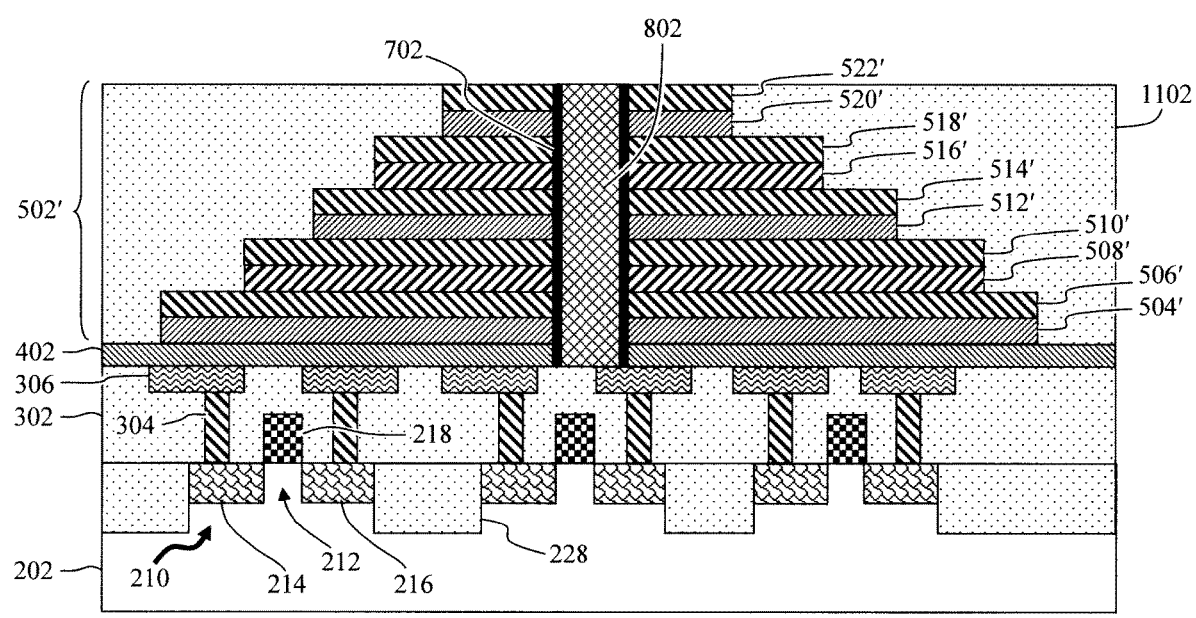
FIG. 11 is a cross-sectional diagram illustrating a (second) ILD having been deposited onto, and burying, the patterned word line/bit line stack according to an embodiment of the present invention.

As shown in FIG. 10, each level in the patterned stack 502' (labeled as L1, L2, L3, etc. for clarity) includes a patterned portion of one of the word lines or bit lines and a patterned portion of the immediately preceding dielectric layer. The patterned portions of word lines 504, 512, 520, etc., dielectric layers 506, 510, 514, 518, 522, etc., and sacrificial bit lines 508, 516, etc. in patterned stack 502' will now be designated as word lines 504', 512', 520', etc., dielectric layers 506', 510', 514', 518', 522', etc., and sacrificial bit lines 508', 516', etc., respectively. Thus, for example, level L 1 in the patterned stack 502' includes word line 504' and dielectric layer 506' and has a width W1, level L2 in the patterned stack 502' includes sacrificial bit lines 508' and dielectric layer 510' and has a width W2, level L3 in the patterned stack 502' includes word line 512' and dielectric layer 514' and has a width W3, level L4 in the patterned stack 502' includes sacrificial bit lines 516' and dielectric layer 518' and has a width W4, and level L5 in the patterned stack 502' includes word line 520' and dielectric layer 522' and has a width W5. As provided above, the footprint of each level moving up the patterned stack 502' gets progressively smaller, namely W5<W4<W3<W2<W1.

According to an exemplary embodiment, standard lithography and etching techniques (see above) are employed to form the staircase design using multiple etching steps performed with a successively smaller mask at each etch step. An anisotropic etch such as RIE can be used for the stack etch. For instance, as shown in FIG. 10, in a first RIE step a mask 1002 having a width W1 can be used to pattern the stack with the footprint and location of level L1. The width of mask 1002 is then shrunk from W1 to W2. A second RIE step is then performed using the mask 1002 now having the width W2 to pattern the stack with the footprint and location of level L2. Again, the width of mask 1002 is shrunk from W2 to W3. A third RIE step is then performed using the mask 1002 now having the width W3 to pattern the stack with the footprint and location of level L3. Yet again, the width of mask 1002 is shrunk from W3 to W4. A fourth RIE step is then performed using the mask 1002 now having the width W4 to pattern the stack with the footprint and location of level L4. Still yet again, the width of mask 1002 is shrunk from W4 to W5. A fifth RIE step is then performed using the mask 1002 now having the width W5 to pattern the stack with the footprint and location of level L5, and so on.

An ILD 1102 is then deposited onto, and burying, the patterned stack 502'. See FIG. 11. For clarity, the terms 'first' and 'second' may also be used herein when referring to ILD 302 and ILD 1102, respectively. Suitable materials for ILD 1102 include, but are not limited to, oxide materials such as SiOx and/or SiCOH and/or ULK-ILD materials such as pSiCOH which can be deposited onto the patterned stack 502' using a process such as CVD, ALD or PVD. Following deposition, the ILD 1102 can be polished using a process such as CMP.

Figure 12:
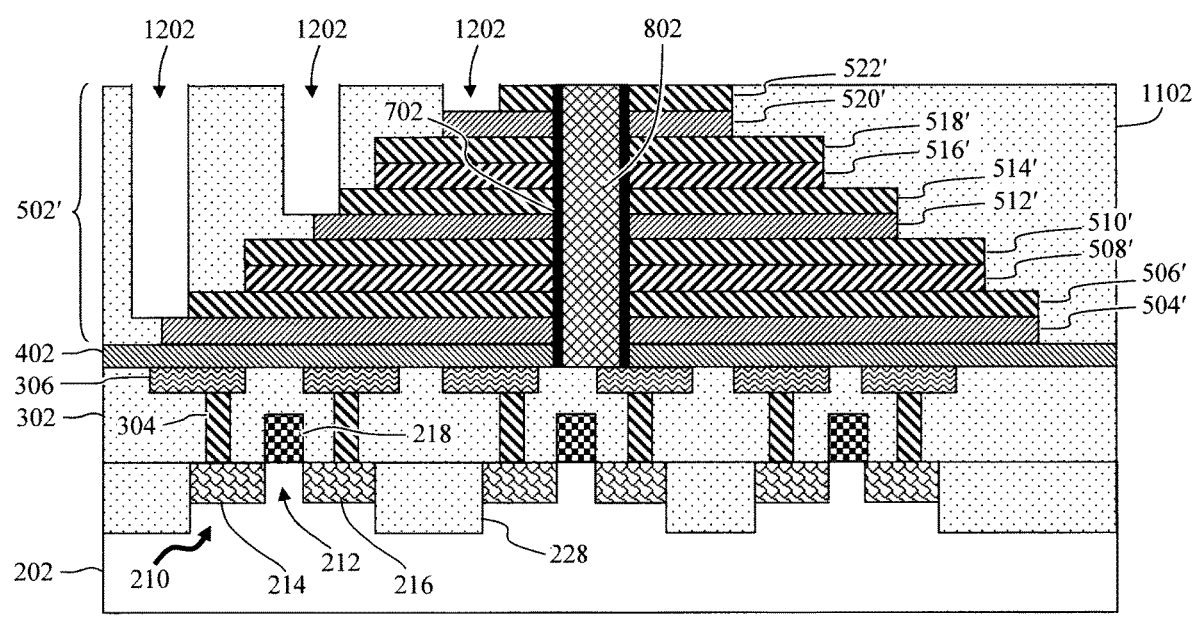
FIG. 12 is a cross-sectional diagram illustrating (first) contact vias having been patterned in the second ILD over each of the word lines according to an embodiment of the present invention.
Figure 13:
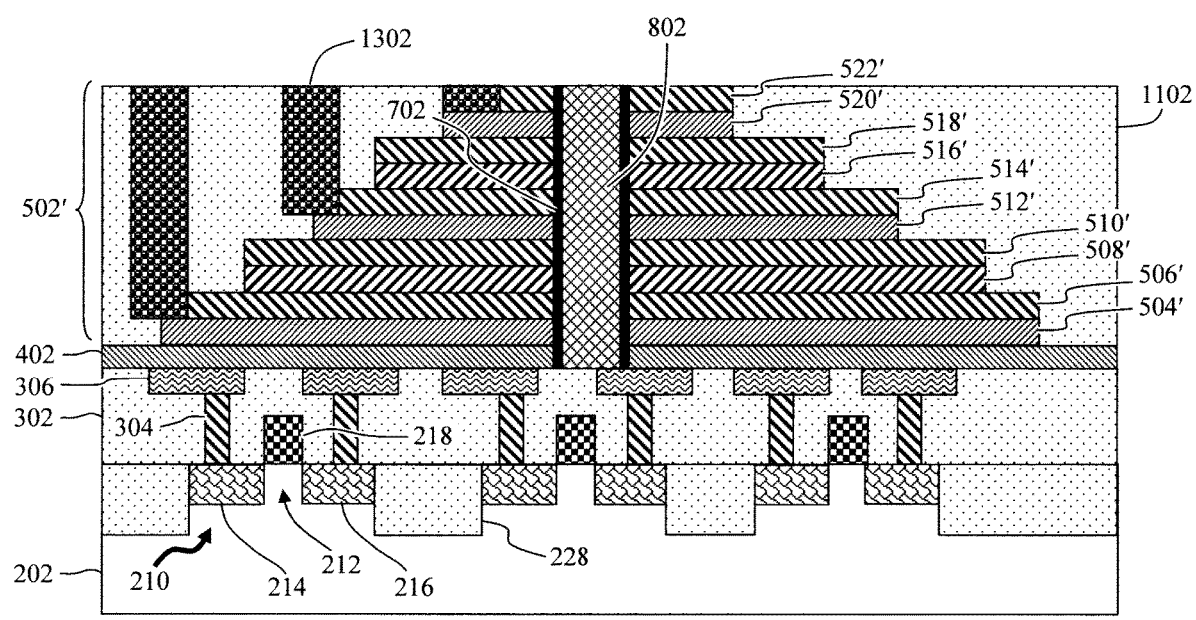
FIG. 13 is a cross-sectional diagram illustrating a metal(s) having been deposited into, and filling the first contact vias to form contacts that are in direct contact with each of the word lines according to an embodiment of the present invention.

Contacts to the word lines 504', 512', 520', etc. are next formed in the ILD 1102. To do so, contact vias 1202 are first patterned in the ILD 1102 over each of the word lines 504', 512', 520', etc. See FIG. 12. As provided above, by way of the present staircase-shaped design, the reduced footprint of each level moving up the patterned stack 502' leaves a portion of the underlying level uncovered. It is by way of this configuration that access is gained to the word lines 504', 512', 520', etc. as shown in FIG. 12. It is notable that the word lines 504', 512', 520', etc. at each respective level of the patterned stack 502' are directly below one of the dielectric layers 506', 514', 522', etc., respectively. Thus, in order to gain access to the word lines 504', 512', 520', etc. themselves, the contact vias 1202 must pass through the dielectric layers 506', 514', 522', etc., respectively.

Standard lithography and etching techniques (see above) can be employed to pattern the contact vias 1202 in the ILD 1102 down to the word lines 504', 512', 520', etc. An anisotropic etching process such as RIE can be employed for the contact via etch. A top surface of each of the word lines 504', 512', 520', etc. is now exposed at a bottom of the respective contact via 1202.

A metal or a combination of metals is then deposited into, and filling the contact vias 1202 to form contacts 1302 that are in direct contact with each of the word lines 504', 512', 520', etc. See FIG. 13. Suitable metals include, but are not limited to, Cu, W, Ru, Co, Ni and/or Pt which can be deposited into the contact vias 1202 using a process such as evaporation, sputtering, or electrochemical plating to form contacts 1302. Following deposition, the metal overburden can be removed using a process such as CMP. Prior to depositing the metal(s), a barrier layer (not shown) can be deposited into and lining the contact vias 1202 to prevent diffusion of the metal(s) into the surrounding ILD 1102. As provided above, suitable barrier layer materials include, but are not limited to, Ru, Ta, TaN, Ti and/or TiN. Additionally, a seed layer (not shown) can be deposited into and lining the contact vias 1202 prior to metal deposition, i.e., in order to facilitate plating of the metal into the contact vias 1202.

The sacrificial bit lines 508', 516', etc. are then selectively removed and replaced with the final, i.e., replacement, bit lines of the device. Prior to placing the replacement bit lines, the floating gate stack 702 is selectively etched away in the area of the sacrificial bit lines 508', 516', etc. thereby enabling the replacement bit lines to directly contact the channel 802. Based on this configuration, the replacement bit lines will also directly contact the floating gate stack 702, while the word lines (i.e., the control gates) are separated from the channel 802 by the floating gate stack 702.

Figure 14:
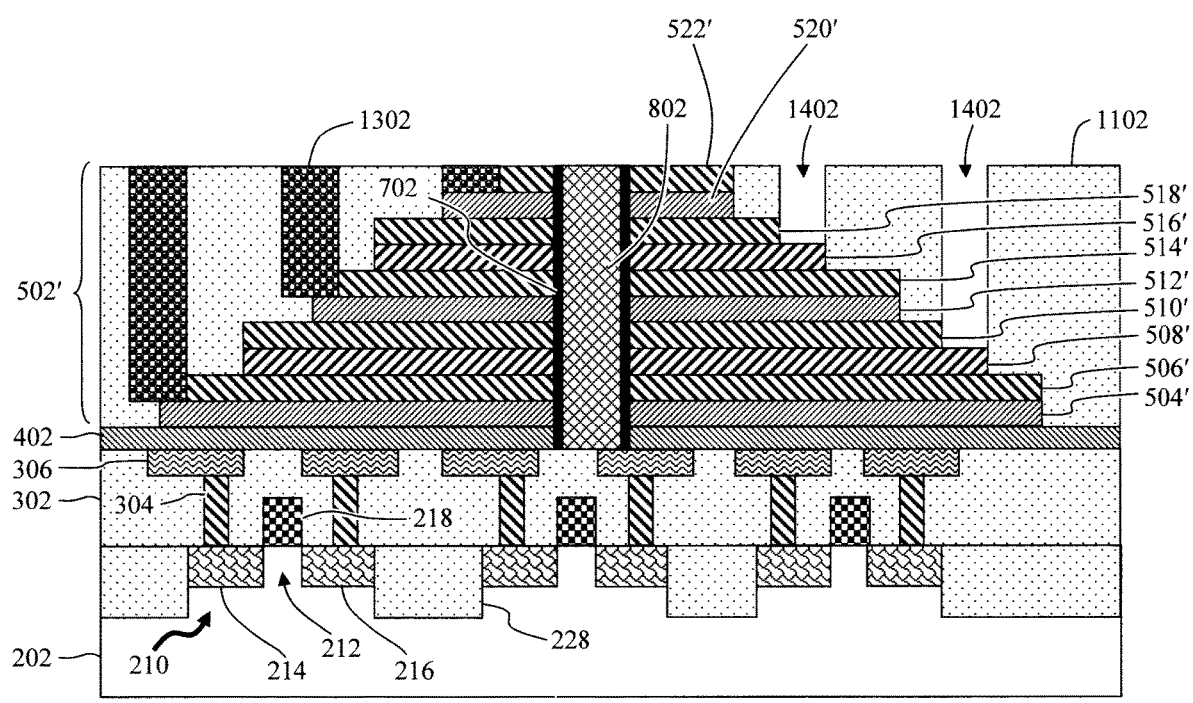
FIG. 14 is a cross-sectional diagram illustrating (second) contact vias having been patterned in the second ILD over each of the sacrificial bit lines according to an embodiment of the present invention.

Removal of the sacrificial bit lines 508', 516', etc. begins with the patterning of contact vias 1402 in the ILD 1102 over each of the sacrificial bit lines 508', 516', etc. See FIG. 14. For clarity, the terms 'first' and 'second' may also be used herein when referring to contact vias 1202 and contact vias 1402, respectively. As provided above, by way of the present staircase-shaped design, the reduced footprint of each level moving up the patterned stack 502' leaves a portion of the underlying level uncovered. It is by way of this configuration that access is gained to the sacrificial bit lines 508', 516', etc. as shown in FIG. 14. It is notable that the sacrificial bit lines 508', 516', etc. at each respective level of the patterned stack 502' are directly below one of the dielectric layers 510', 518', etc., respectively. Thus, in order to gain access to the sacrificial bit lines 508', 516', etc. themselves, the contact vias 1402 must pass through the dielectric layers 510', 518', etc., respectively.

Standard lithography and etching techniques (see above) can be employed to pattern the contact vias 1402 in the ILD 1102 down to the sacrificial bit lines 508', 516', etc. An anisotropic etching process such as RIE can be employed for the contact via etch. A top surface of each of the sacrificial bit lines 508', 516', etc. is now exposed at a bottom of the respective contact via 1402 which enables the sacrificial bit lines 508', 516', etc. to be removed.

Figure 15:
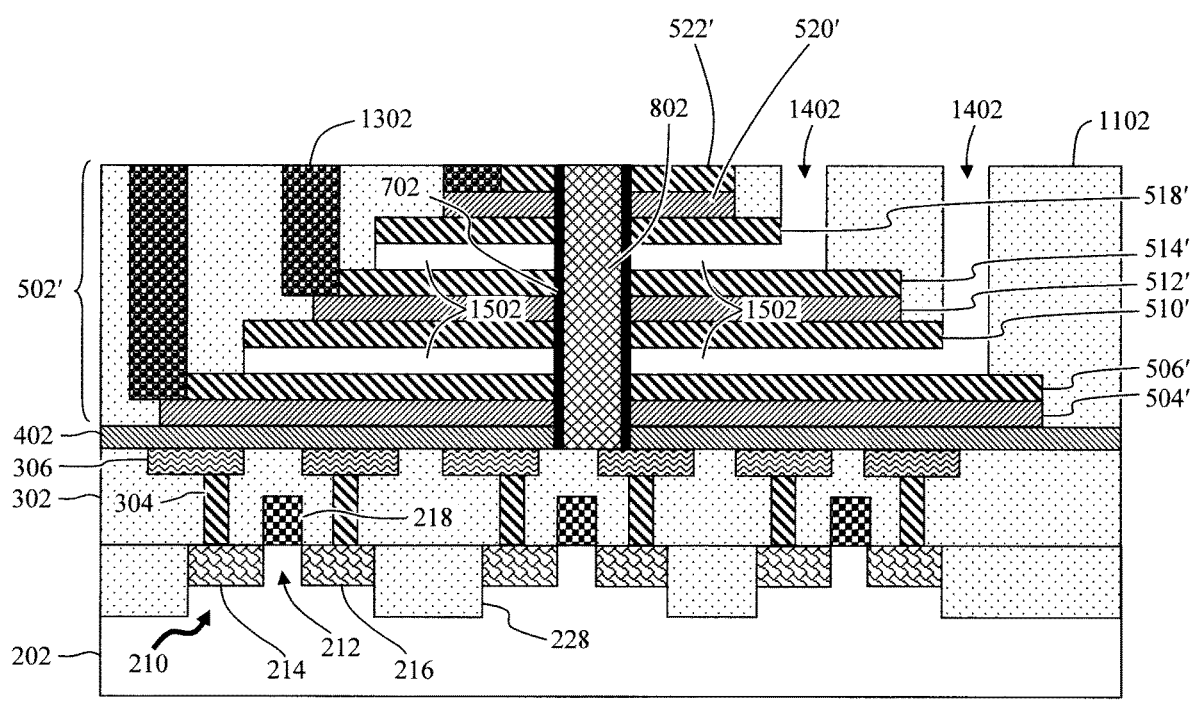
FIG. 15 is a cross-sectional diagram illustrating the sacrificial bit lines having been selectively removed through the second contact vias forming (first) cavities in the patterned word line/bit line stack according to an embodiment of the present invention.

Namely, as shown in FIG. 15, the sacrificial bit lines 508', 516', etc. are then selectively removed through the contact vias 1402 forming cavities 1502 in the patterned stack 502'. It is notable that, as provided above, the layers of the patterned stack 502' are continuous around the channel 802 and floating gate stack 702. Thus, access (by way of the contact vias 1402) at one end of the sacrificial bit lines 508', 516', etc. enables complete removal of the sacrificial bit lines 508', 516', etc., in their entirety, from the patterned stack 502'. As shown in FIG. 15, the cavities 1502 are present in between dielectric layers 506'/510' and dielectric layers 514'/518'.

The sacrificial bit lines 508', 516', etc. can be selectively removed from the patterned stack 502' using a variety of different etching or removal processes which vary depending on the composition of the sacrificial bit lines 508', 516', etc. For instance, as provided above, amorphous carbon is ashable and thus can be selectively removed using an ashing process. For polysilicon, a polysilicon-selective wet chemical or gas-phase etch can be employed. A plasma etch with a hydrogen-containing fluorocarbon gas and an oxygen-containing gas can be employed to selectively etch SiC.

Formation of the cavities 1502 provides access to the floating gate stack 702 alongside the channel 802 in the area of the (now removed) sacrificial bit lines 508', 516', etc. An etch-back of the floating gate stack 702 through the cavities 1502 is then performed to selectively expose the channel 802 in between the dielectric layers 506' and 510', and in between the dielectric layers 514' and 518', forming cavities 1602 alongside the channel 802. See FIG. 16. For clarity, the terms 'first' and 'second' may also be used herein when referring to cavities 1502 and cavities 1602.

Figure 16:
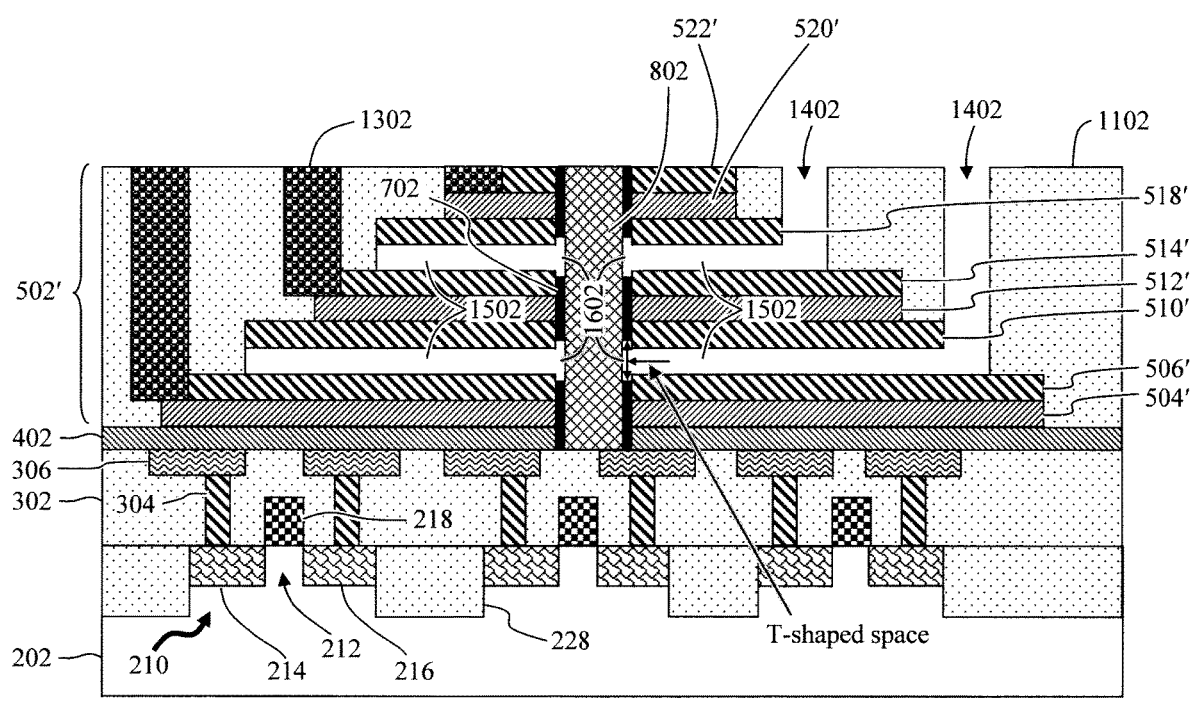
FIG. 16 is a cross-sectional diagram illustrating an etch-back of the floating gate stack through the first cavities having been performed to selectively expose the channel, forming (second) cavities alongside the channel, whereby the first and second cavities provide a T-shaped space alongside the channel according to an embodiment of the present invention.

This etch-back of the floating gate stack 702 through the cavities 1502 can be performed using an isotropic etching process such as a wet chemical etch or a gas phase etch. For instance, as provided above, the floating gate stack 702 includes a combination of oxide and nitride (or polysilicon) materials. In that case, a combination of oxide- and nitride-selective isotropic etching steps (or polysilicon-selective etch as the case may be) can be employed to etch-back the floating gate stack 702. As shown in FIG. 16, this process results in a unique structure along the sidewalls of the channel 802. Namely, the combination of cavities 1502 and cavities 1602 provide a T-shaped space (when viewed in cross-section) alongside the channel 802. As will be described in detail below, this (T-shaped) space will be used to form replacement bit lines (also having this T-shaped design) that are in direct contact with both the floating gate 702 and the channel 802.

Namely, a metal or a combination of metals is next deposited into, and filling contact vias 1402 and cavities 1502 and 1602 to form replacement bit lines 1702 and 1704 that are in direct contact with both the floating gate stack 702 and the channel 802. See FIG. 17. Suitable metals include, but are not limited to, Cu, W, Ru, Co, Ni and/or Pt which can be deposited into the contact vias 1402 and cavities 1502 and 1602 using a process such as evaporation, sputtering, or electrochemical plating to form replacement bit lines 1702 and 1704. Following deposition, the metal overburden can be removed using a process such as CMP. Prior to depositing the metal(s), a barrier layer (not shown) can be deposited into and lining the contact vias 1402 and cavities 1502 and 1602 to prevent diffusion of the metal(s) into the surrounding ILD 1102. As provided above, suitable barrier layer materials include, but are not limited to, Ru, Ta, TaN, Ti and/or TiN. Additionally, a seed layer (not shown) can be deposited into and lining the contact vias 1402 and cavities 1502 and 1602 prior to metal deposition, i.e., in order to facilitate plating of the metal into the contact vias 1402 and cavities 1502 and 1602. Also, prior to depositing the metal (s), a diffusion process can be used to dope the channel so that a lower resistance contact can be formed for the replacement bit lines 1702 and 1704. For example, n-type or p-type dopant gas phase diffusion can be used at a temperature of from about 600 degrees Celsius (° C.) to about 1000° C. for doping the contact. Suitable n-type dopants include, but are not limited to phosphorous (P) and/or arsenic (As), and suitable p-type dopants include, but are not limited to, boron (B).

Figure 17:
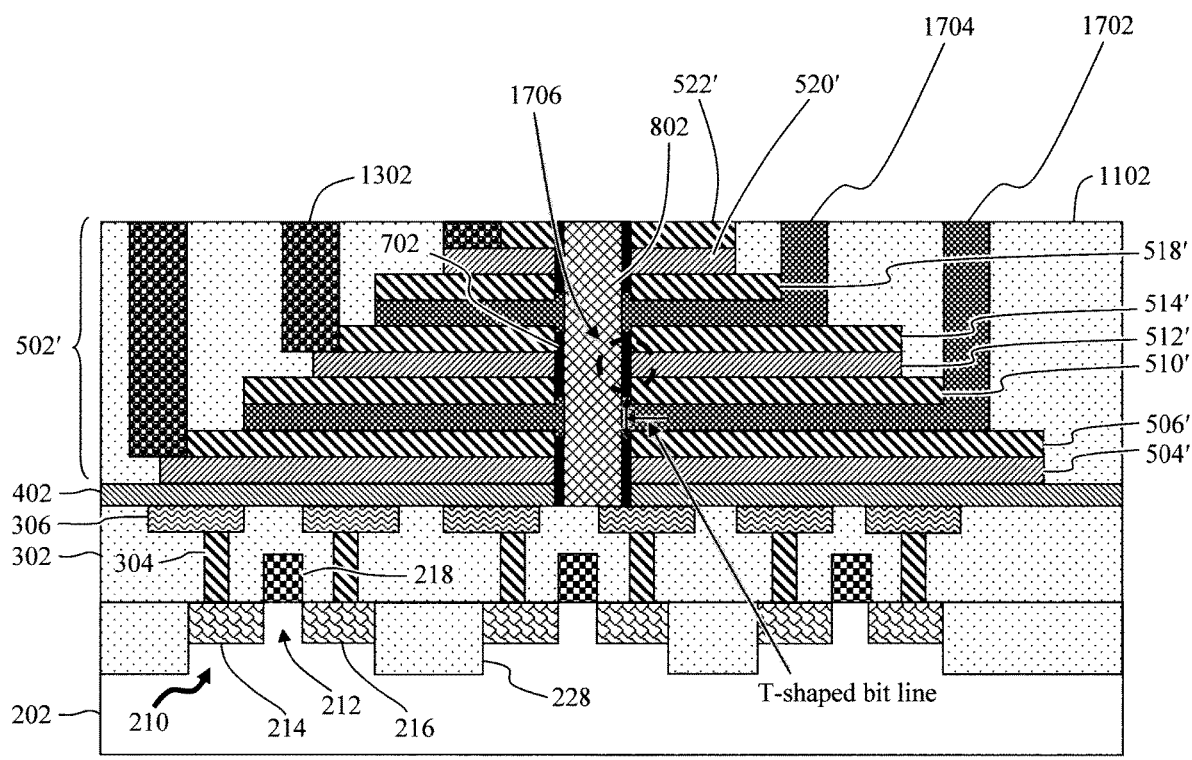
FIG. 17 is a cross-sectional diagram illustrating a metal(s) having been deposited into, and filling the second contact vias and first/second cavities to form replacement bit lines that are in direct contact with both the floating gate stack and the channel, whereby the replacement bit lines also have a T-shape alongside the channel according to an embodiment of the present invention.

As shown in FIG. 17, the replacement bit lines 1702 and 1704 fill the contact vias 1402 and cavities 1502 and 1602 and thus take on this unique T-shaped configuration of the space created by cavities 1502 and 1602 adjacent to the channel 802 (from etch-back of the floating gate stack 702 as described above). As such, replacement bit lines 1702 and 1704 also have a unique T-shape (when viewed in cross-section) alongside the channel 802.

Figure 17A:
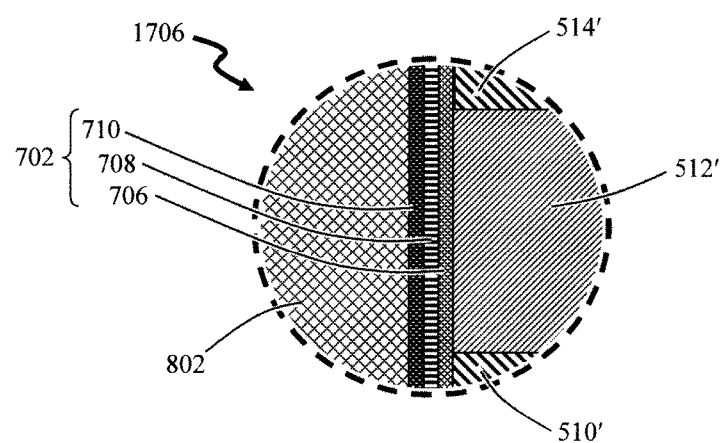
FIG. 17A is a magnified view illustrating that each floating gate transistor includes a control gate (i.e., a word line) separated from the floating gate by the gate oxide and the channel separated from the floating gate by the tunnel oxide according to an embodiment of the present invention.

As shown in FIG. 17, the present 3D NOR flash memory device includes a plurality of floating gate transistors 1706 that are connected in parallel forming a NOR circuit. Referring briefly to FIG. 17A which provides a magnified view of one of the floating gate transistors 1706, each floating gate transistor 1706 includes a control gate (i.e., a word line 504', 512', 520', etc.) separated from the floating gate 708 by the gate oxide 706 and the channel 802 separated from the floating gate 708 by the tunnel oxide 710.

An ILD 1802 is next formed on the ILD 1102 over the patterned stack 502', the contacts 1302/word lines 504', 512', 520', etc. and the replacement bit lines 1702 and 1704. See FIG. 18. For clarity, the term 'third' may also be used herein when referring to ILD 1802 so as to distinguish it from the 'first' ILD 302 and the 'second' ILD 1102. Suitable materials for ILD 1802 include, but are not limited to, oxide materials such as SiOx and/or SiCOH and/or ULK-ILD materials such as pSiCOH which can be deposited onto the ILD 1102 using a process such as CVD, ALD or PVD. Following deposition, the ILD 1802 can be polished using a process such as CMP.

Figure 18:
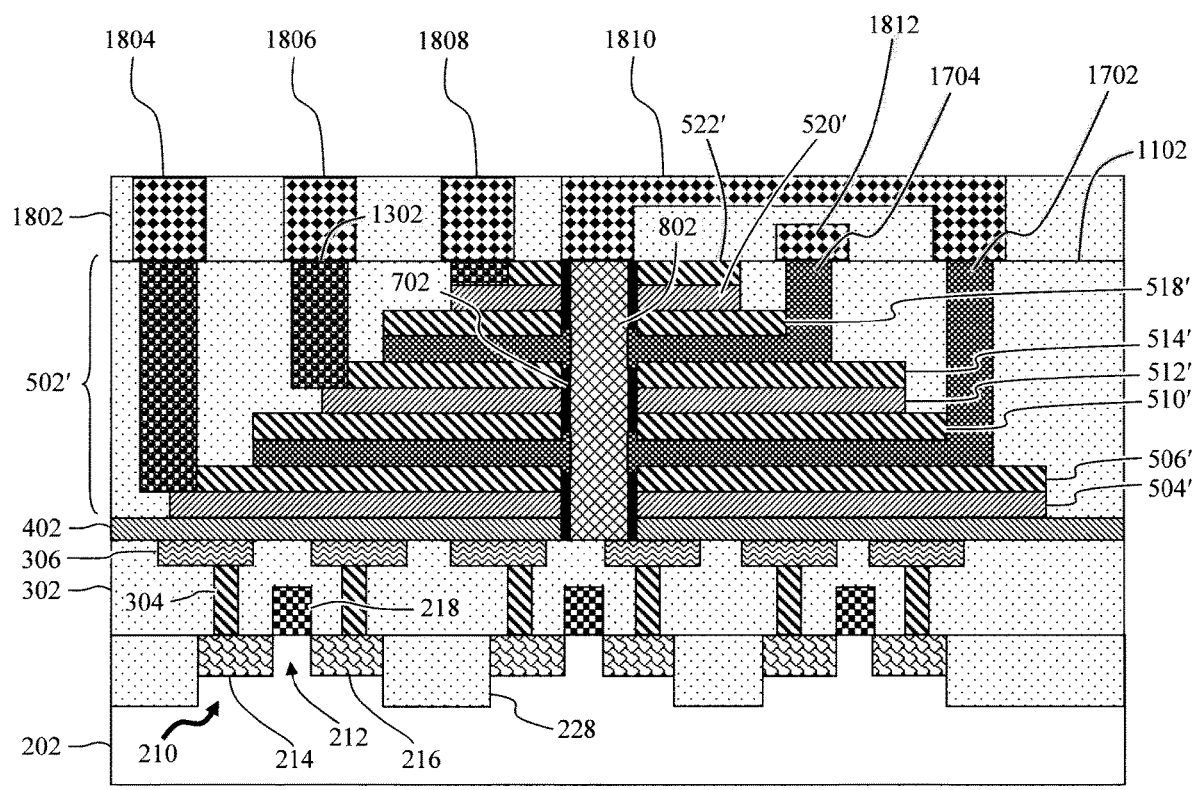
FIG. 18 is a cross-sectional diagram illustrating a (third) ILD having been formed on the second ILD over the patterned word line/bit line stack, the contacts/word lines and the replacement bit lines, individual top word line contacts having been formed in the third ILD that are in direct contact with the contacts to each of the word lines, a top bit line contact having been formed in the third ILD in direct contact with the channel and one of the replacement bit lines, and a peripheral contact having been formed in the third ILD in direct contact with another one of the replacement bit lines according to an embodiment of the present invention.

Top word line and bit line contacts are then formed in the ILD 1802 in direct contact with the contacts 1302 to word lines 504', 512', 520', etc. and with the replacement bit lines 1702 and 1704, respectively. The placement of these top word line and bit line contacts can vary depending on the particular application at hand. For instance, the present 3D NOR flash memory can be configured to serve as a neuromorphic computing device. As shown in FIG. 18, according to an exemplary embodiment this configuration involves forming individual top word line contacts 1804, 1806 and 1808 in the ILD 1802 that are in direct contact with the contacts 1302 to each of the word lines 504', 512', 520', etc., respectively. For clarity, the terms 'first,' 'second' and 'third' may also be used herein when referring to top word line contacts 1804, 1806 and 1808, respectively. A top bit line contact 1810 is formed in the ILD 1802 in direct contact with the channel 802 and the replacement bit line 1702. A peripheral contact 1812 (e.g., to a pulse generator or current integrator circuit) is formed in the ILD in direct contact with the replacement bit line 1704. Some of the word lines 504', 512', 520', etc. can also be biased to turn off the device, such that it functions as isolation between pairs of NOR flash memory.

To form the top word line, bit line and peripheral contacts in the ILD 1802, standard lithography and etching techniques (see above) can be employed to first pattern features (e.g., vias and/or trenches) in ILD 1802 with the footprint and location of the top word line contacts 1804, 1806 and 1808, top bit line contact 1810, and peripheral contact 1812. The features are then filled with a contact metal(s). As provided above, suitable contact metals include, but are not limited to, Cu, W, Ru, Co, Ni and/or Pt which can be deposited into the features using a process such as evaporation, sputtering or electrochemical plating to form the top word line contacts 1804, 1806 and 1808, top bit line contact 1810, and peripheral contact 1812. Prior to depositing the contact metal(s), a barrier layer (not shown) can be deposited into and lining the features to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the features prior to contact metal deposition to facilitate plating of the contact metal(s). It is notable that multiple patterning and metallization stages may be needed to form peripheral contact 1812.

Figure 19:
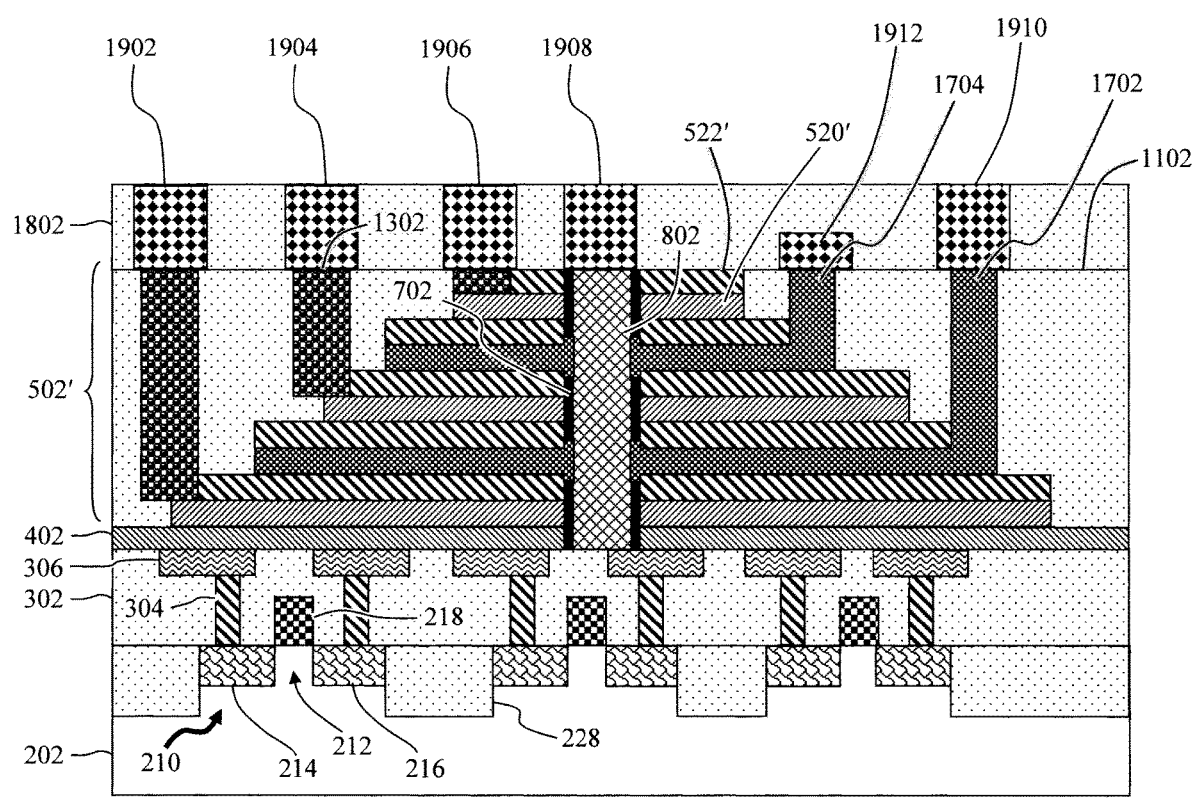
FIG. 19 is a cross-sectional diagram illustrating individual top word line contacts having been formed in the third ILD that are in direct contact with the contacts to each of the word lines, first/second top bit line contacts having been formed in the third ILD that are in direct contact with the channel and one of the replacement bit lines, and a peripheral contact having been formed in the third ILD in direct contact with another one of the replacement bit lines according to an embodiment of the present invention.

Another exemplary configuration of the present 3D NOR flash memory as a neuromorphic computing device is shown in FIG. 19. Like the example described in conjunction with the description of FIG. 18 above, individual top word line contacts 1902, 1904 and 1906 are formed in the ILD 1802 that are in direct contact with the contacts 1302 to each of the word lines 504', 512', 520', etc., respectively. However, rather than having a single common top bit line contact, in this configuration individual (first/second) top bit line contacts 1908 and 1910 are formed in the ILD 1802 that are in direct contact with the channel 802 and the replacement bit line 1702, respectively. A peripheral contact 1912 (e.g., to a pulse generator or current integrator circuit) is formed in the ILD in direct contact with the replacement bit line 1704. Some of the word lines 504', 512', 520', etc. can also be biased to turn off the device, such that it functions as isolation between pairs of NOR flash memory.

In the same manner as described above, standard lithography and etching techniques (see above) can be employed to first pattern features (e.g., vias and/or trenches) in ILD 1802 with the footprint and location of the top word line contacts 1902, 1904 and 1906, top bit line contacts 1908 and 1910, and peripheral contact 1912. The features are then filled with a contact metal(s). As provided above, suitable contact metals include, but are not limited to, Cu, W, Ru, Co, Ni and/or Pt which can be deposited into the features using a process such as evaporation, sputtering or electrochemical plating to form the top word line contacts 1902, 1904 and 1906, top bit line contacts 1908 and 1910, and peripheral contact 1912. Prior to depositing the contact metal(s), a barrier layer (not shown) can be deposited into and lining the features to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the features prior to contact metal deposition to facilitate plating of the contact metal(s). It is notable that multiple patterning and metallization stages may be needed to form peripheral contact 1912.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A memory device, comprising:
   a word line/bit line stack comprising alternating word lines and bit lines separated by dielectric layers disposed on a substrate;
   a channel that extends vertically through the word line/bit line stack; and
   a floating gate stack surrounding the channel, wherein the floating gate stack is present between the word lines and the channel, and wherein the bit lines are in direct contact with both the channel and the floating gate stack.

2. The memory device of claim 1, wherein the word line/bit line stack has a staircase design.

3. The memory device of claim 1, wherein the bit lines are T-shaped alongside the channel.

4. The memory device of claim 1, wherein the floating gate stack comprises:
   a tunnel oxide disposed on the channel;
   a floating gate disposed on the tunnel oxide; and
   a gate oxide disposed on the floating gate.

5. The memory device of claim 4, wherein the tunnel oxide and the gate oxide each comprises silicon oxide.

6. The memory device of claim 4, wherein the floating gate comprises a material selected from the group consisting of: polysilicon, silicon nitride, and combinations thereof.

7. The memory device of claim 4, wherein the gate oxide separates the floating gate from the word lines.

8. The memory device of claim 1, further comprising:
   at least one field effect transistor (FET) present on the substrate;
   an interlayer dielectric (ILD) disposed on the substrate over the at least one FET;
   source/drain contacts in the ILD that are in direct contact with source/drain regions of the at least one FET; and
   metal pads in the ILD that are in direct contact with the source/drain contacts.

9. The memory device of claim 8, wherein the channel is in direct contact with at least one of the metal pads.

10. The memory device of claim 1, further comprising:
    an ILD disposed on the word line/bit line stack; and
    contacts in the ILD that are in direct contact with each of the word lines.

11. The memory device of claim 10, further comprising:
    individual top word line contacts that are in direct contact with the contacts to each of the word lines.

12. The memory device of claim 10, further comprising:
    a top bit line contact that is in direct contact with both the channel and one of the bit lines.

13. A neuromorphic computing device, comprising:
    a word line/bit line stack having a staircase design comprising alternating word lines and bit lines separated by dielectric layers disposed on a substrate;
    a channel that extends vertically through the word line/bit line stack;
    a floating gate stack surrounding the channel, wherein the floating gate stack is present between the word lines and the channel, and wherein the bit lines are in direct contact with both the channel and the floating gate stack;
    individual top word line contacts to each of the word lines; and
    at least one top bit line contact to the channel and the bit lines.

14. The neuromorphic computing device of claim 13, wherein the at least one top bit line contact is in direct contact with both the channel and one of the bit lines.

15. The neuromorphic computing device of claim 13, wherein the at least one top bit line contact comprises a first top bit line contact in direct contact with the channel, and a second top bit line contact in direct contact with one of the bit lines.

* * * * *